(12) United States Patent  
Kelekar

(10) Patent No.: US 8,715,518 B2  
(45) Date of Patent: *May 6, 2014

(54) GAS BARRIER WITH VENT RING FOR PROTECTING A SURFACE REGION FROM LIQUID

(75) Inventor: Rajesh Kelekar, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 174 days.

This patent is subject to a terminal disclaimer.

(21) Appl. No.: 13/272,041

(22) Filed: Oct. 12, 2011

(65) Prior Publication Data

US 2013/0095667 A1   Apr. 18, 2013

(51) Int. Cl.
*H01L 21/302* (2006.01)
*B08B 3/04* (2006.01)
*C23F 1/02* (2006.01)

(52) U.S. Cl.
USPC .......... 216/41; 216/45; 216/83; 216/84; 438/745; 438/758; 134/2; 134/902; 156/345.11; 156/345.48; 156/345.19; 118/720; 118/721; 506/33

(58) Field of Classification Search
None
See application file for complete search history.

(56) References Cited

U.S. PATENT DOCUMENTS

| | | | |
|---|---|---|---|
| 4,953,389 A | 9/1990 | Schurch | |
| 6,142,017 A | 11/2000 | Glassey | |
| 6,357,907 B1 | 3/2002 | Cleveland et al. | |
| 6,601,888 B2 | 8/2003 | Mcilwraith et al. | |
| 6,764,386 B2 | 7/2004 | Uziel | |
| 7,098,045 B2 * | 8/2006 | Noji et al. | 438/5 |
| 7,456,930 B2 | 11/2008 | Hazelton et al. | |
| 7,472,786 B2 | 1/2009 | Komori | |
| 7,583,357 B2 | 9/2009 | Donders et al. | |
| 2010/0300492 A1 | 12/2010 | Magni et al. | |
| 2011/0209663 A1* | 9/2011 | Endo et al. | 118/719 |
| 2013/0160858 A1* | 6/2013 | Francis | 137/1 |

FOREIGN PATENT DOCUMENTS

WO   2008121561 A1   10/2008

* cited by examiner

*Primary Examiner* — Anita Alanko

(57) ABSTRACT

A protective chuck is disposed on a substrate with a gas bearing layer between the bottom surface of the protective chuck and the substrate surface. The gas bearing layer protects a surface region against a fluid layer covering the substrate surface. The protection of the gas bearing is a non-contact protection, reducing or eliminating potential damage to the substrate surface due to friction. The gas bearing can enable combinatorial processing of a substrate, providing multiple isolated processing regions on a single substrate with different material and processing conditions.

19 Claims, 15 Drawing Sheets

Supplying a gas flow to an interior of a protective chuck, wherein the gas exits the protective chuck at a first location of a bottom surface, and a portion of the gas flow returns to the protective chuck at a second location of the bottom surface
1300

Lowering the protective chuck onto a substrate so that the bottom surface of the protective chuck is disposed in proximity to a surface region of the substrate, wherein the gas flow at the bottom surface causes the protective chuck to be levitated above the surface region, and
wherein the gas flow at the bottom surface protects the surface region from a fluid disposed on the substrate outside the surface region
1310

Controlling the gas flow to achieve a desired boundary region between the fluid outside the surface region and the gas within the surface region
1320

Controlling a conductance of the gas flow path to control a gas pressure between the bottom of the protective chuck and the region surface
1330

Measuring a gas pressure between the bottom of the protective chuck and the region surface
1340

Dynamically regulating the gas flow to achieve a desired gas pressure between the bottom of the protective chuck and the region surface
1350

FIG. 13

Establishing a gas layer between a bottom surface of a protective chuck and a surface region of a substrate, wherein the gas layer at the bottom surface causes the protective chuck to be levitated above the surface region
1400

Supplying a fluid on the remaining surface of the substrate for processing the remaining surface of the substrate, wherein the surface region is protected from being processed by the fluid due to the gas layer
1410

Adjusting a gas flow or adjusting a gas flow path conductance to achieve a desired gas pressure at the gas layer
1420

Measuring a gas pressure between the bottom of the protective chuck and the region surface; and dynamically regulating the gas flow to achieve a desired gas pressure at the gas layer
1430

Cleaning the remaining surface of the substrate or wet etching the remaining surface of the substrate
1450

Submerging the substrate in a fluid tank with the surface region protected by the gas layer of the protective chuck
1460

Regulating the gas layer to generate and/or collapse bubbles at a boundary region between the fluid outside the surface region and the gas layer within the surface region
1470

FIG. 14

GAS BARRIER WITH VENT RING FOR PROTECTING A SURFACE REGION FROM LIQUID

FIELD OF THE INVENTION

The present invention relates generally to combinatorial methods for device process development.

BACKGROUND OF THE INVENTION

The manufacture of advanced semiconductor devices entails the integration and sequencing of many unit processing steps, with potential new material and process developments. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been used in wet chemical processing such as etching and cleaning. HPC processing techniques have also been used in deposition processes such as physical vapor deposition (PVD), atomic layer deposition (ALD), and chemical vapor deposition (CVD).

In standard HPC systems, multiple site isolated regions on a substrate surface can be formed by sealing different regions of the surface, isolating the surface regions from each other. The surface sealing can generate particles, which requires subsequent substrate cleaning. Therefore there is a need for non-contact isolation of surface regions on a substrate surface.

SUMMARY OF THE DESCRIPTION

In some embodiments, the present invention discloses systems and methods for isolating a surface region of a substrate during a wet processing of the remaining surface without contacting the surface. For example, the substrate surface is covered with a fluid to clean or wet etch the substrate surface. The present invention forms a gas layer on a surface region of the substrate, protecting the surface region from being similarly processed by the fluid.

In some embodiments, the present invention discloses a protective chuck disposed on a surface region of a substrate with a gas bearing layer in between. The gas bearing comprises a gas layer with adequate gas pressure to levitate the protective chuck above the substrate surface, preventing the protective chuck from contacting the substrate, and to form a barrier region, blocking the outside fluid.

In some embodiments, the present invention discloses methods for processing a substrate, using a protective chuck configured for forming a gas bearing at a bottom surface of the protective chuck. The present selective processing methods can be used in high productivity combinatorial processes, achieving multiple isolated regions with different properties, which can be used for evaluating and optimizing materials and fabrication process conditions. For example, a large matrix screening can be performed through multiple isolated regions on a single wafer, providing a quick and cost effective way for new device and material developments.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 13 illustrates an exemplary flowchart for processing a substrate using a protective chuck according to some embodiments of the present invention.

FIG. 14 illustrates another exemplary flowchart for processing a substrate using a protective chuck according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to systems and methods for isolating a surface region of a substrate during a wet processing of the remaining surface without contacting the surface. The present non-contact isolation can reduce or eliminate particulates or debris, especially at the boundary of the protected region. In some embodiments, the present invention discloses methods and systems for use in high productivity combinatorial processes.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
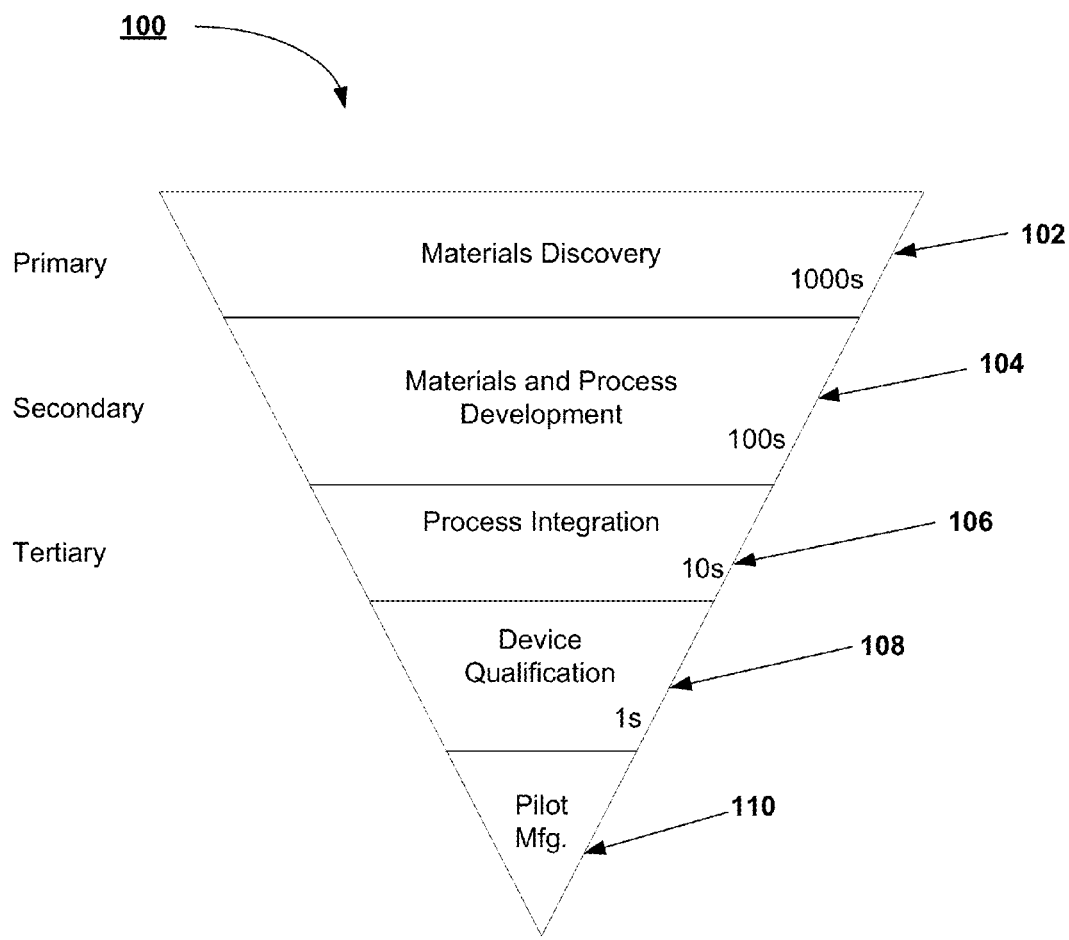
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of device fabrication processes by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the device. For example, such structures may include, but would not be limited to, gate dielectric layers, gate electrode layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
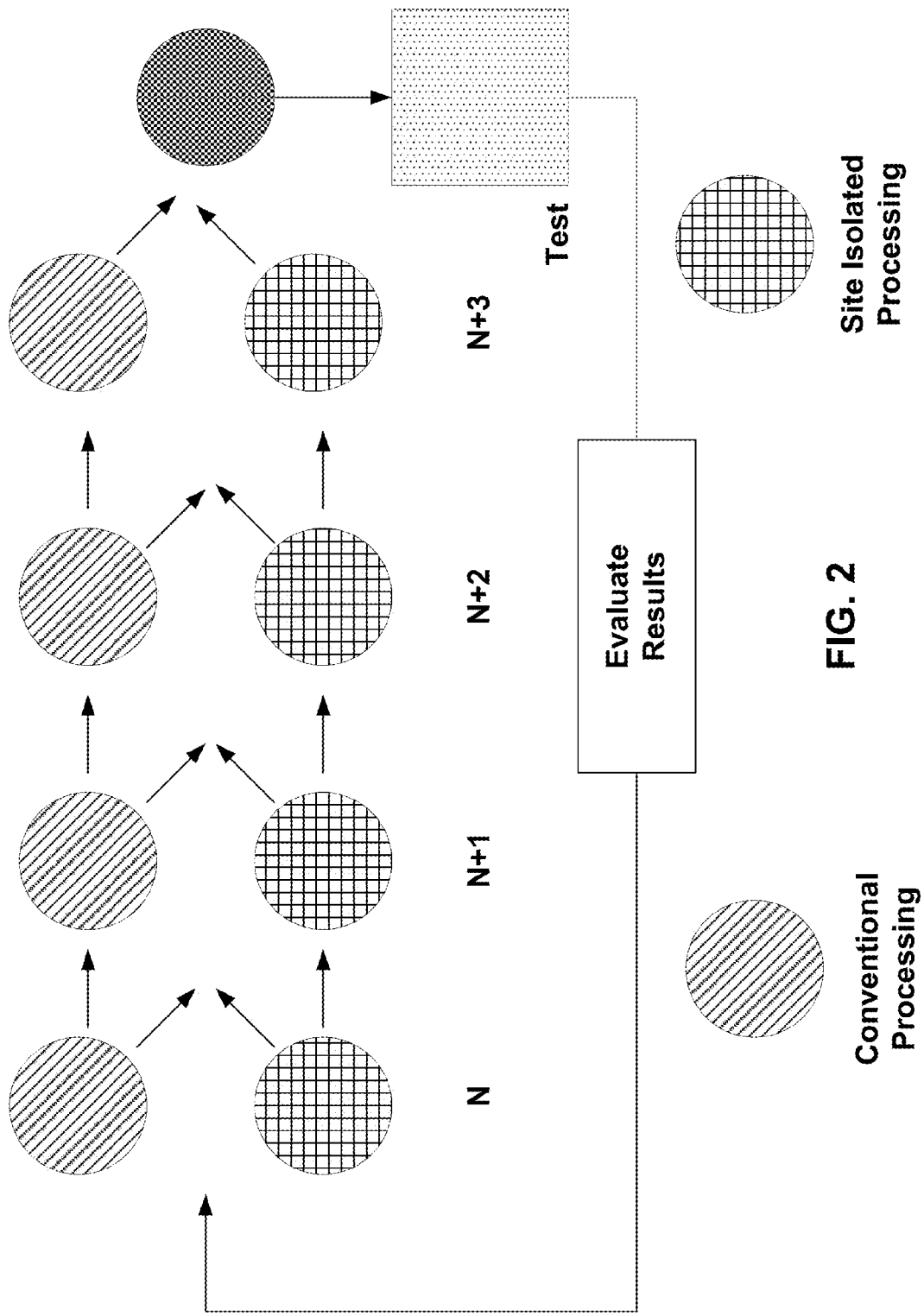
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
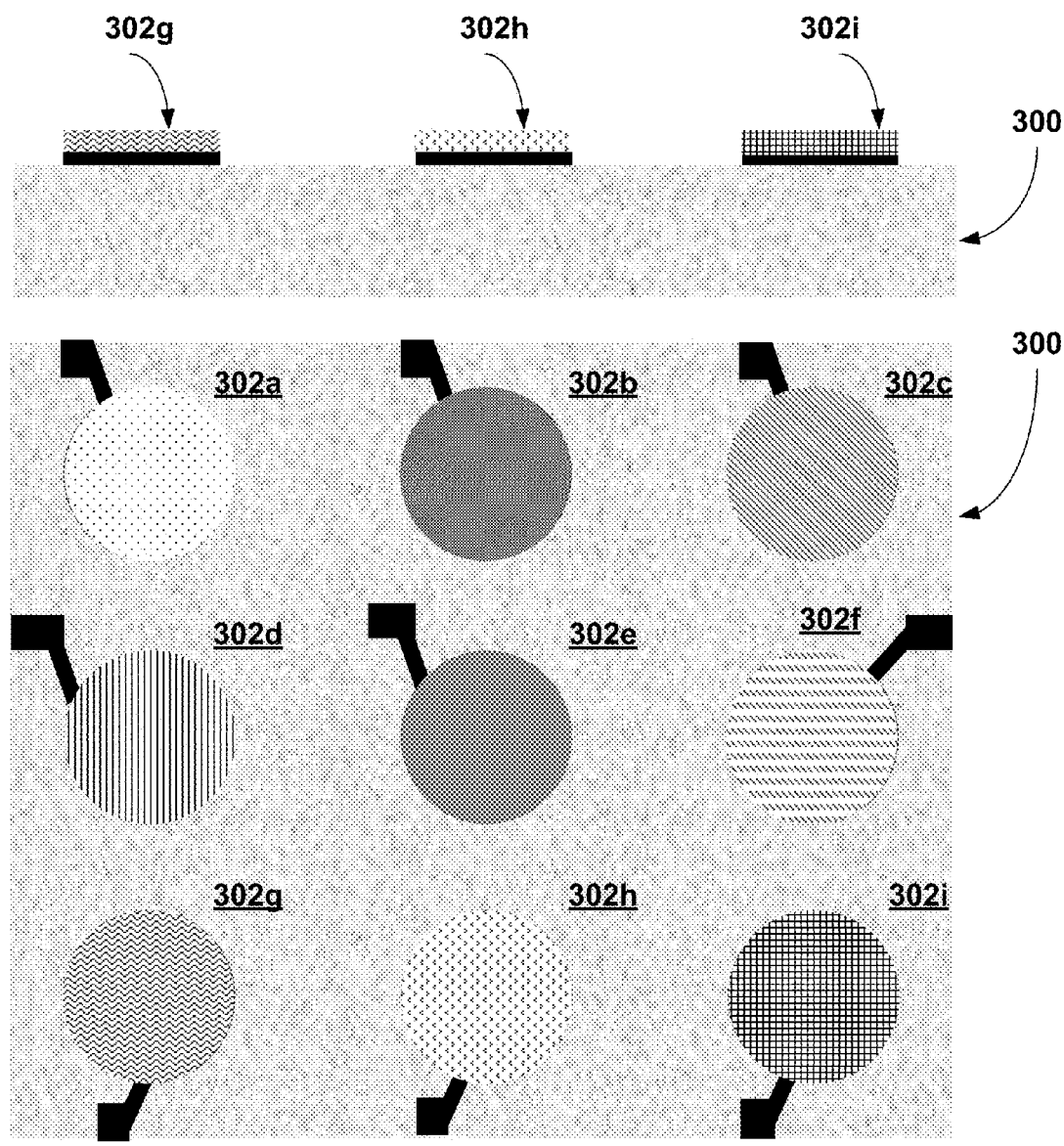
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302a-302i, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302g-302i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
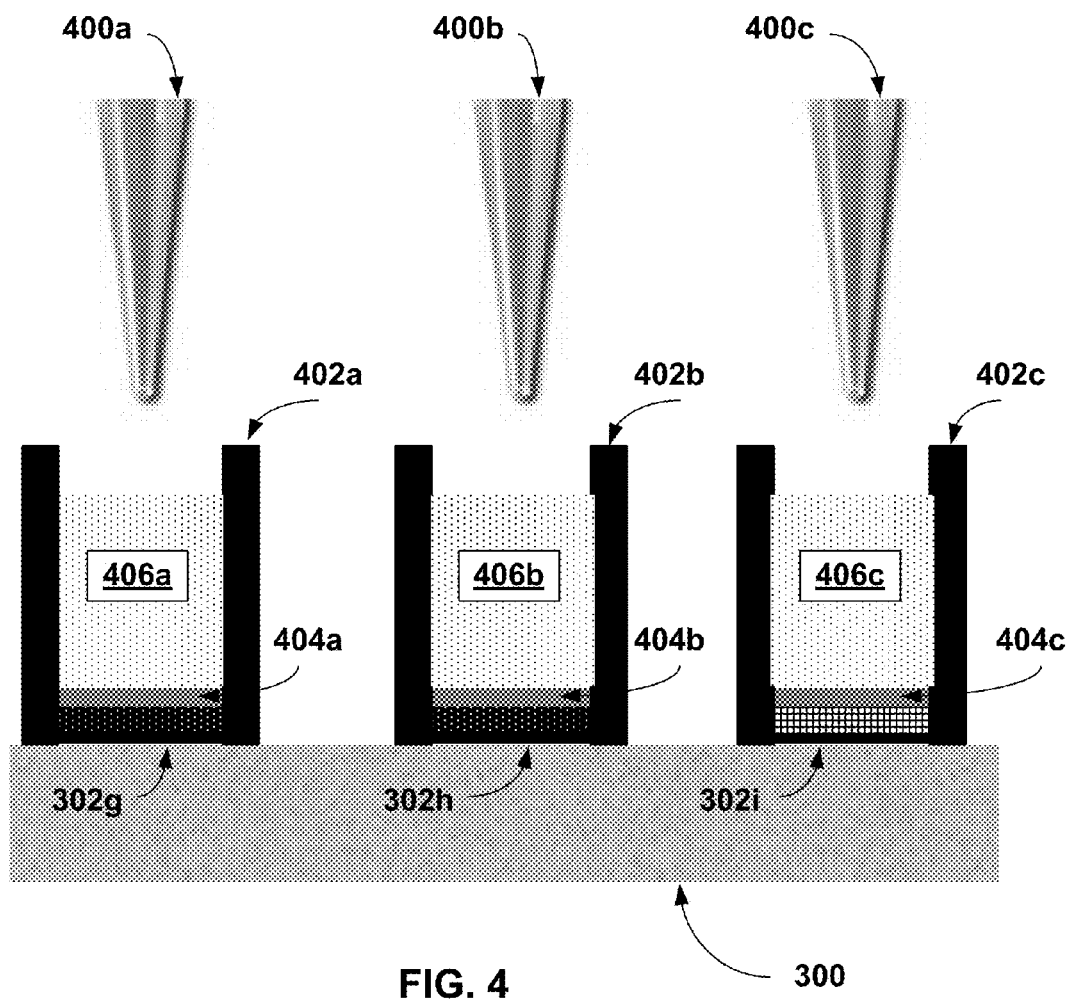
FIG. 4 illustrates a schematic diagram of a combinatorial wet processing system according to an embodiment described herein.

FIG. 4 illustrates a schematic diagram of a combinatorial wet processing system according to an embodiment described herein. A combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 4 illustrates a cross-sectional view of substrate, 300, taken through the three site isolated regions, 302g-302i similar to the upper portion of FIG. 3. Solution dispensing nozzles, 400a-400c, supply different solution chemistries, 406a-406c, to chemical processing cells, 402a-402c. FIG. 4 illustrates the deposition of a layer, 404a-404c, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In some embodiments, the site isolated regions are the areas of interest in a combinatorial process, since they provide the variations of process and material parameters, which can be evaluated to obtain the optimum device structures and fabrication processes. In some embodiments, the surface areas outside the isolated regions are also processed, such as, to clean or etch the outside surface area. For example, to clean the outside surface areas with a wet cleaning fluid, the isolated regions are protected and cleaning chemical is introduced to the substrate surface.

In some embodiments, the present invention discloses methods for processing a substrate, comprising forming a surface region on the substrate that are protected from an outside fluid. The surface region on the substrate is formed without any physical contact with the substrate, preventing any generation of particulates or debris caused by contact friction.

In some embodiments, the substrate surface is covered with a fluid, for example, to clean or wet etch the substrate surface. The present non-contact protected surface regions can allow the exclusion of certain surface areas on the substrate from being similarly processed by the fluid without any potential damage caused by added particles.

In some embodiments, the present invention discloses a protective chuck disposed on a surface region of a substrate with a gas bearing layer in between. The gas bearing comprises a gas layer with adequate gas pressure to levitate the protective chuck about the substrate surface, preventing the protective chuck from contacting the substrate, and to form a barrier region, blocking the outside fluid.

Figure 5A:
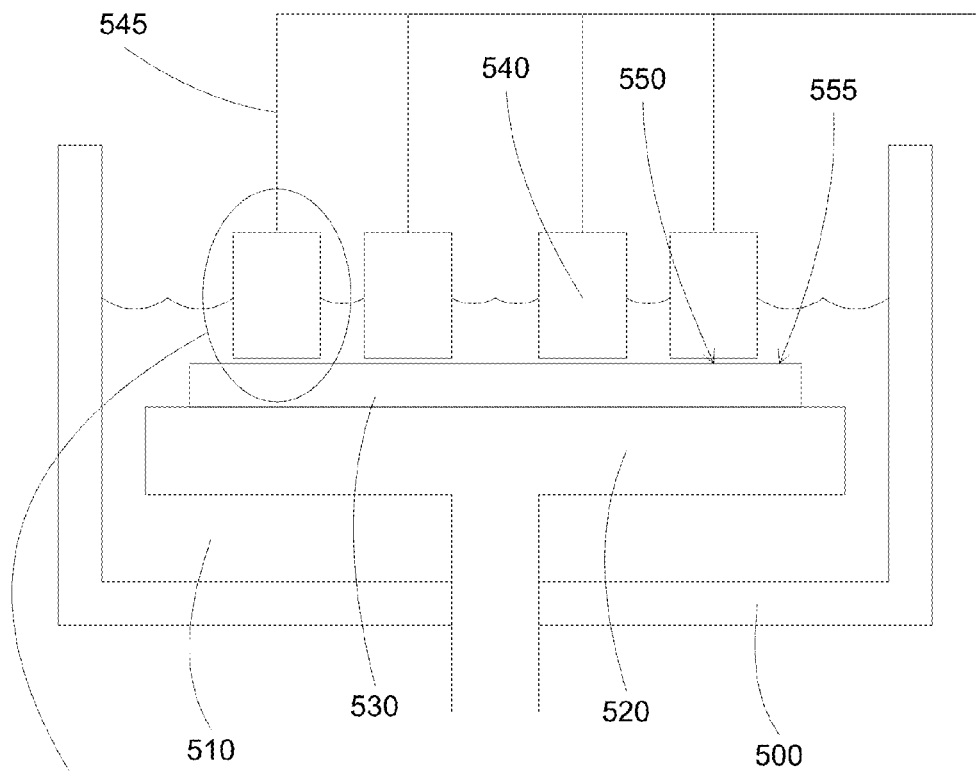
FIGS. 5A-5B illustrate an exemplary surface protection with air bearing layer according to some embodiments of the present invention.
Figure 5B:
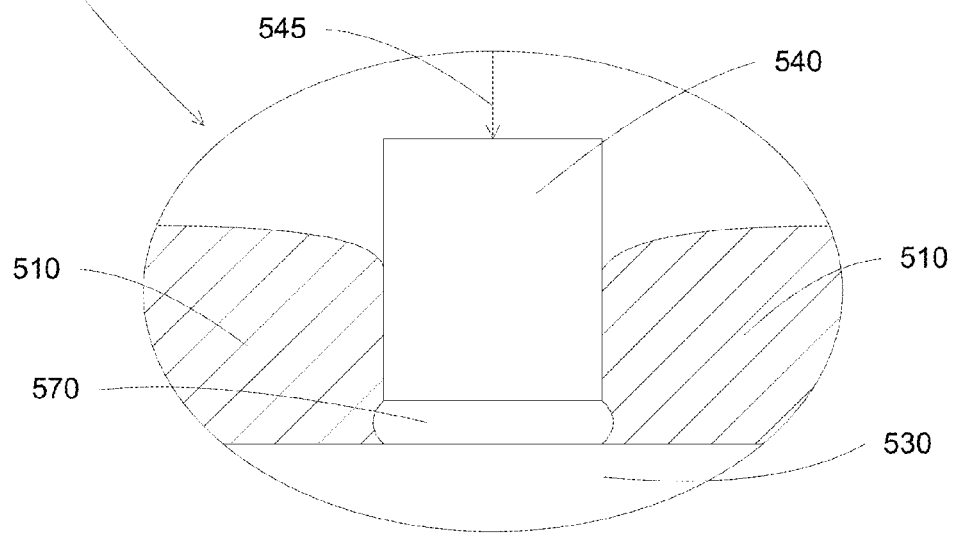

FIGS. 5A-5B illustrate an exemplary surface protection with air bearing layer according to some embodiments of the present invention. In FIG. 5A, a process chamber 500 supports a chuck 520 having a substrate 530 disposed thereon. The substrate 530 is submerged in a processing fluid 510, for example, a cleaning fluid, a rinsing fluid, or an etching fluid. The process chamber 500 can be a part of a HPC system, which comprises a plurality of protective chucks 540 protecting isolated regions 550 of the substrate. Gas lines 545 can be supplied to the protective chucks 540, for example, to pressurize the inside of the protective chucks 540 against the surrounding fluid 510. The surface area 555 of the substrate, outside the protected isolated regions 550, is processed by the processing fluid 510.

FIG. 5B shows an exemplary configuration of a protective chuck 540 protecting surface 550 regions of the substrate 530 against the fluid processing 510. A gas layer 570 is formed under the protective chuck 540, for example, with supplied gas coming from gas inlet 545. The gas layer 570 forms a pressurized layer, preventing the fluid 510 from entering the surface region 550. The fluid 510 thus stays within the surface region 555, outside the region 550. The gas layer 570 provides a non-contact protection of the region 550, eliminating any particle or debris generation due to abrasive contacts.

In some embodiments, the protective chuck comprises a substantially flat bottom surface, e.g., the surface to be disposed in proximity with the substrate surface. The protective chuck also comprises a second surface covering the remaining surface of the protective chuck, including the side surface and the top surface. The substantially flat bottom surface can form a substantially uniform gap with the substrate, enabling a gas flow across the flat bottom surface to create a gas bearing through a higher pressure gas layer than the outside ambient.

Figure 6A:
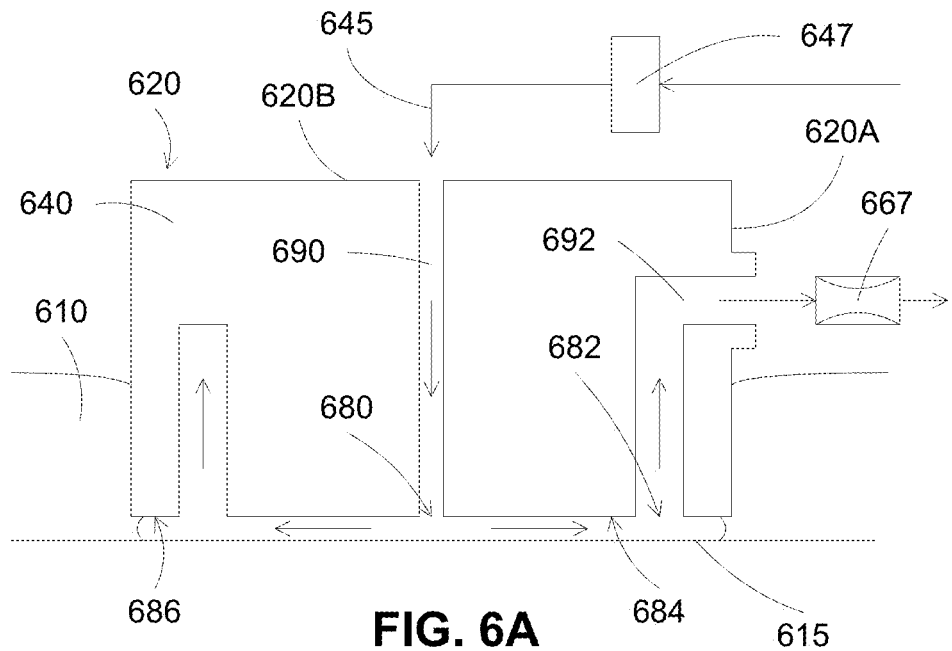
FIGS. 6A-6B illustrate an exemplary protective chuck according to some embodiments of the present invention.
Figure 6B:
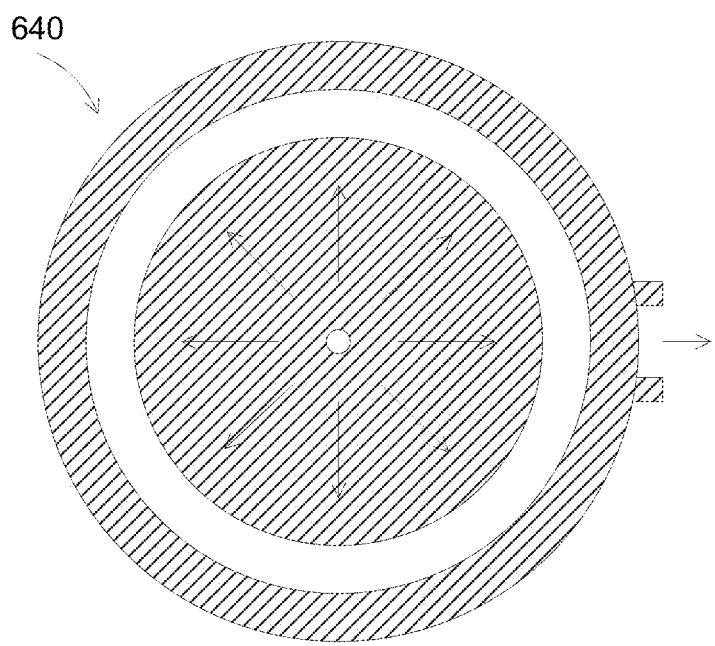

FIGS. 6A-6B illustrate an exemplary protective chuck according to some embodiments of the present invention. FIG. 6A shows a cross section side view and FIG. 6B shows a bottom view of the protective chuck 640. The protective chuck 640 comprises a substantially flat bottom surface 684 and 686, to be disposed in close proximity with the substrate surface 615. The protective chuck also comprises a second surface 620, covering the rest of the chuck surface, for example, comprising a top surface 620B and a side surface 620A. The second surface can be used for gas connection, such as inlet and outlet ports for gas supply to form the gas bearing layer.

In some embodiments, the bottom flat surface comprises two substantially flat areas: an outer substantially flat area 686 surrounding a peripheral of the bottom surface and an inner substantially flat area 684 surrounding an inner opening 680, such as a recessed area. The inner opening 680 is preferably disposed at a center of the bottom surface, but can be located anywhere within the inner substantially flat area 684. The area 682 between the outer flat area 686 and the inner flat area 684 is also preferably recessed, forming an outer recessed ring 682 surrounding the inner flat area. A gas flow 647 between the opening 680 and the recessed area 682 along the inner flat area 684 can establish a gas layer, which can act as an air bearing to levitate the protective chuck 640 above the substrate surface 615.

The opening 680 and the recessed area 682 are coupled to first and second conduits 690 and 692, respectively, leading to the second surface 620, e.g., the outside surface of the protective chuck, to form an inlet and an outlet of a gas flow. For example, first conduit 690 connects the inner opening 680 with the top surface 620B of the chuck. Second conduit 692 connects the outer recessed area 682 with the side surface 620A of the chuck. Coupling can be provided at the end of the conduits at the outside surface for ease of connection to an external gas flow assembly. One conduit can serve as a gas inlet, and the other conduit served as a gas outlet. For example, the first conduit 690 can accept a gas input flow through a coupling to a gas source 645, preferably through a flow meter 649 to measure the gas flow, or a flow controller to control the gas flow. The second conduit 692 can be left open, forming a vent ring that releases the gas output flow to atmosphere. A restricting valve 667 can be coupled to the gas output flow, for example, externally to the protective chuck after the gas outlet, or internally within the second conduit, to regulate a flow resistance, or a flow conductance, of the gas flow, effectively affecting the gas pressure at the gas bearing layer. For example, with a same gas flow at the first conduit inlet, a more restricted second conduit would increase the gas pressure at the gas bearing layer.

The gas flow between the first and second conduits along the inner substantially flat area forms a gas layer that levitates the protective chuck and protects the surface region of the substrate from a fluid disposed on the substrate outside the surface region. Higher gas flow can increase a lift force, providing a larger air gap between the protective chuck and the substrate surface. More restricted outlet conduit can increase a gas pressure at the air gap, protecting the surface region under the protective chuck from the outside fluid.

In some embodiments, the outer and the inner substantially flat areas are formed from a one-piece component, which can improve the stability of the protective chuck. For example, the protective chuck can be formed of a one-piece component, with the opening 680 and the recess area 682 machined on the one-piece component to form the outer and the inner substantially flat areas 686 and 684.

Figure 7A:
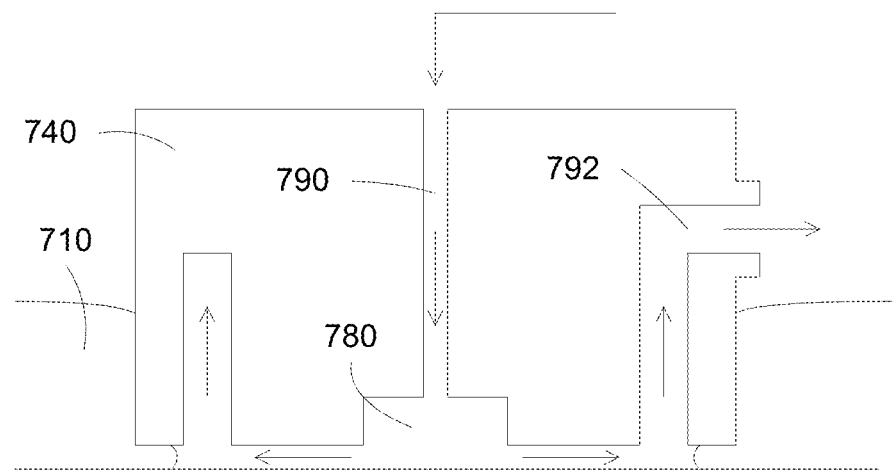
FIGS. 7A-7B illustrate exemplary protective chuck configurations according to some embodiments of the present invention.
Figure 7B:
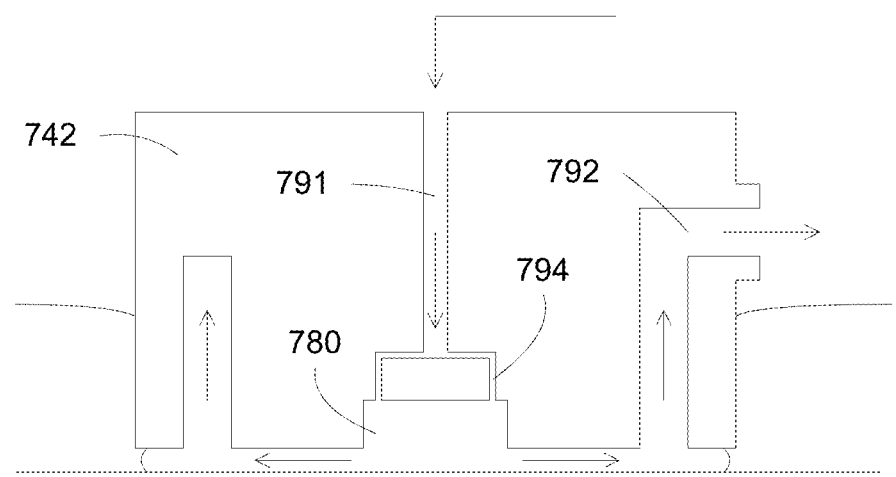

FIGS. 7A-7B illustrate exemplary protective chuck configurations according to some embodiments of the present invention. In FIG. 7A, protective chuck 740 comprises an inner flat area 784 surrounding an inner recessed area 780, which form a pocket of gas pressure within the inner recessed area 780. The inner recessed area 780 is coupled to the first conduit 790 to provide an input gas for the gas bearing layer. Second conduit 792 provides an exhaust for the input gas after passing through the inner flat area 784. With a same outer recessed ring 782 and outer flat area 786, the inner flat area 784 is reduced with the enlarging of the inner recessed area 780. In general, the lift force is proportional to the inner flat area 784, enlarging the inner recessed area 780 can reduce the lift force of the protective chuck. Smaller lift force can reduce the gap between the protective chuck and the substrate surface, which can prevent outside fluid flow toward the protected region under the protective chuck 740. Small gap between the protective chuck and the substrate surface can also prevent the gas flow across the inner flat surface 784, affecting the effectiveness of the gas bearing layer, especially for small gas flows.

In some embodiments, the inlet of the first conduit 791 at the outer surface of the protective chuck is coupled to a gas source to provide a gas flow to the gas bearing layer. The outlet of the first conduit 791 can comprise a plurality of outlets 794 distributed in a peripheral of the inner recessed area. The peripheral distribution of the plurality of outlets is preferably uniform, allowing an even distribution of gas flow along the inner flat area of the protective chuck. As shown in FIG. 7B, protective chuck 742 comprises a plurality of smaller conduits 794 coupled to first conduit 791, and delivering inlet gas to the inner recessed area 780 through a plurality of small holes 895.

In some embodiments, the second conduit provides an exhaust for the gas flow. The inlet of the second conduit is preferably distributed along a peripheral of the inner flat area, comprising a ring inlet coupled to a peripheral area, e.g., the outer recessed area, between the inner and outer substantially flat areas for collecting gas flow along the inner flat area. The first and second conduits are preferably configured to provide a uniform flow at the gas bearing, for example, generating a laminar flow with minimum turbulence.

Figure 8:
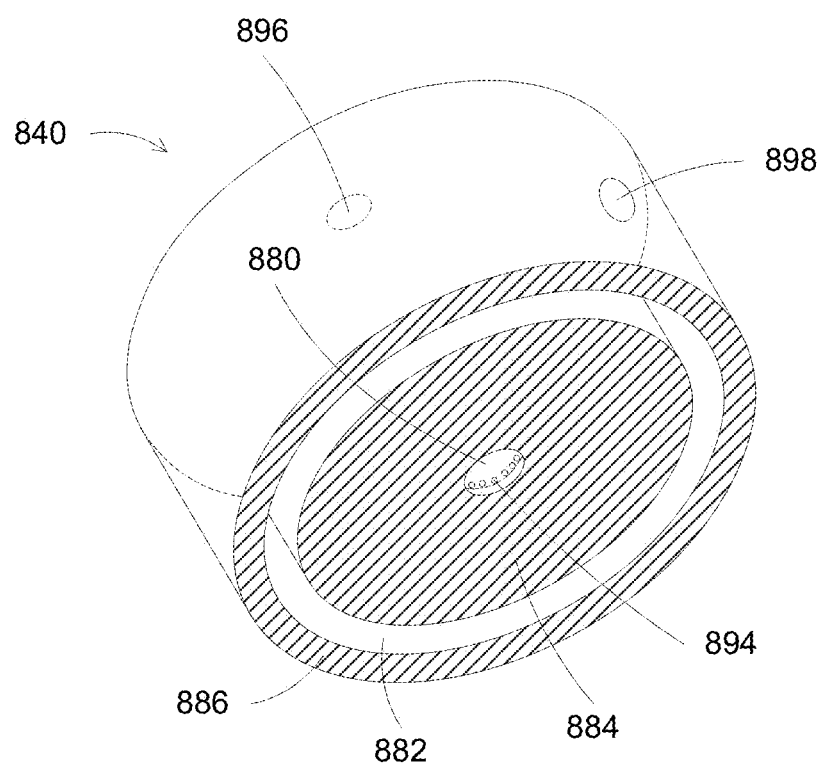
FIG. 8 illustrates a perspective view of an exemplary protective chuck according to some embodiments of the present invention.

FIG. 8 illustrates a perspective view of an exemplary protective chuck according to some embodiments of the present invention. Protective chuck 840 comprises a bottom surface comprising an inner flat ring 884 and an outer flat ring 886, sandwiching an outer recessed ring 882, which is fluidly coupled to outlet coupling 898 at an outer surface. Outlet coupling 898 is disposed at a side surface of the protective chuck 840. An inner recessed area 880 is disposed in the middle of the inner flat ring 884, comprising plurality of small holes 894 fluidly coupled to another outlet coupling 896 at an outer surface. Outlet coupling 896 is disposed at a top surface of the protective chuck 840. A first conduit (not shown in this figure, but similar to first conduit 891 shown in FIG. 7B) couples the outlet coupling 896 with the inner recessed area 880. A second conduit (not shown in this figure, but similar to second conduit 892 shown in FIG. 7B) couples the outer recessed ring 882 with the outlet coupling 898. A gas supply can be coupled to outlet coupling 896 to create a gas flow along the first conduit to the inner recessed area 880, which then flows across the inner flat ring 884 and exhausts to the outer recessed ring 882 and, through the second conduit, to the outlet coupling 898.

Figure 9A:
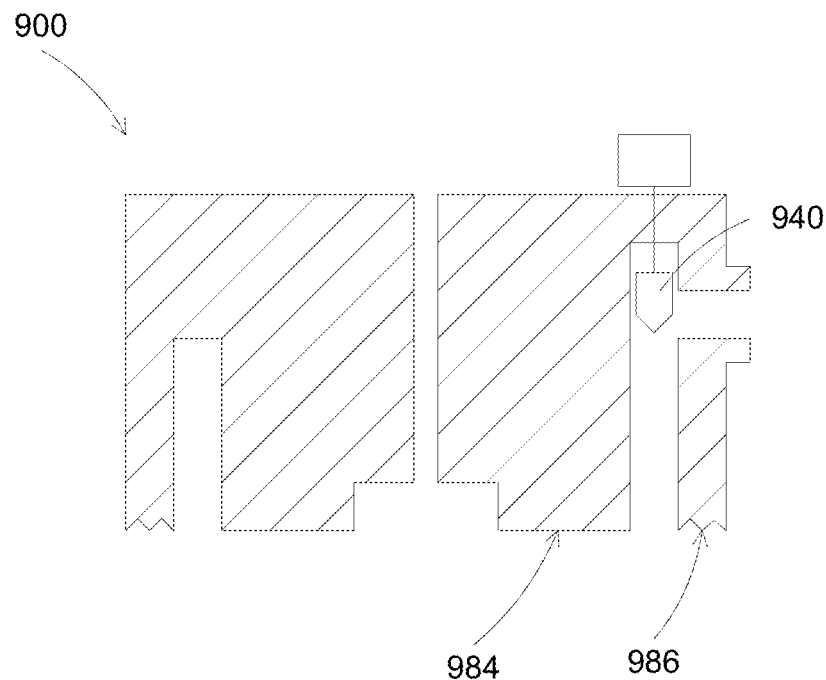
FIGS. 9A-9B illustrate exemplary protective chuck configurations according to some embodiments of the present invention.
Figure 9B:
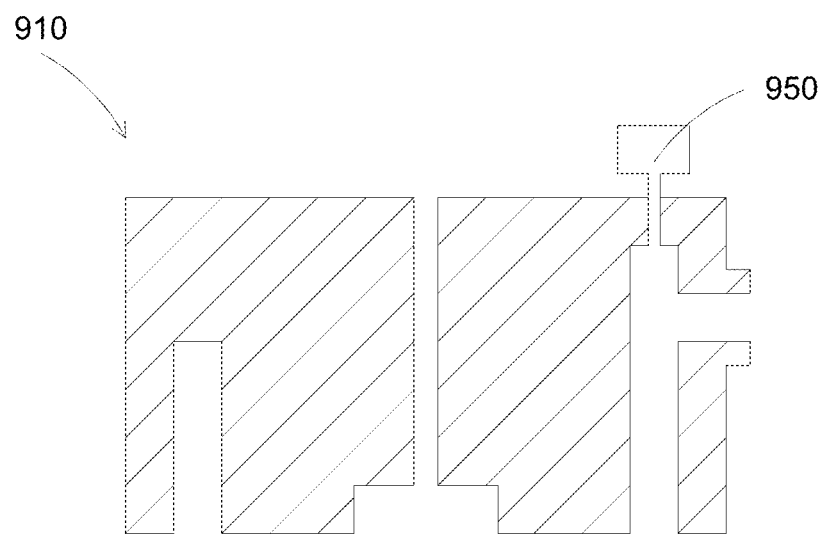

FIGS. 9A-9B illustrate exemplary protective chuck configurations according to some embodiments of the present invention. The protective chuck can comprise integrated flow restrictor, rough surface and pressure gauge coupling to enhance functionality and flexibility.

In some embodiments, the protective chuck can comprise a flow restricting mechanism at the exhaust, for example, to regulate the flow conductance, and consequently the pressure at the gas bearing layer. FIG. 9A shows a protective chuck 900 having a valve 940 coupled to outlet conduit 992 to restrict an exhaust flow of the gas bearing layer. The valve 940 can be a manual valve, which is manually adjusted to achieve a desired gas bearing layer. The valve 940 can be an automatic valve, which can be adjusted by a controller, for example, in response to a pressure reading, to dynamically regulate a desired gas bearing layer.

In some embodiments, the surface 986 of the outer flat area is configured to be rougher than the surface 984 of the inner flat area of the protective chuck 900. The roughness is preferably microscopic, for example, on the order of micron roughness. A flat inner surface 984 is preferred to achieve an effective gas bearing layer. A flat, but microscopically rougher than the inner flat surface 984, outer surface 986 can be used to create higher resistance to the fluid flow toward the protected region under the protective chuck.

In some embodiments, a pressure gauge is provided to measure the gas pressure of the gas bearing. The pressure gauge can be coupled to the bottom surface, such as at the inner or outer recessed areas. In some embodiments, a dead area can be provided for pressure measurement, avoiding measuring directly at a gas flow path. FIG. 9B shows a protective chuck 910 having a recessed area 950 coupled to a pressure gauge 955 to measure the gas pressure at the exhaust flow 992. Other locations within the gas flow can be used.

In some embodiments, the present invention discloses methods for processing a substrate, using a protective chuck configured for forming a gas bearing at a bottom surface of the protective chuck. After supplying a gas flow to the protective chuck to create a gas flow along the bottom surface, the protective chuck is lowered onto a substrate. Under appropriate conditions, such as proper gas flow and air gap between the bottom surface of the protective chuck and the substrate surface, the gas flow can cause the protective chuck to be levitated above the substrate surface, forming a surface region on the substrate that is protected by the gas bearing layer against a fluid disposed on the substrate surface outside the surface region.

In some embodiments, the gas flow to the protective chuck exits at a first location on the bottom surface, releasing to the air ambient. The first location can be disposed at a middle area of the bottom surface, and preferably configured to be distributed along a peripheral of a center area for uniform flowing across the bottom surface area. Upon approaching the substrate surface, the gas flow runs along the gap between the bottom surface of the protective chuck and the substrate surface. Upon encountered and blocked by the outside fluid, the gas flow escapes through a second location on the bottom surface. The second location can be disposed at a peripheral of the bottom surface, and preferably surrounding the bottom surface, leaving a small bottom surface ring around the outer edge of the protective chuck.

In some embodiments, the protective chuck protects the surface region from the fluid without contacting the surface region. The gas pressure of the gas bearing layer can be configured to balance the fluid flow, forcing the fluid to stay outside the surface region protected by the protective chuck. The boundary between the gas layer and the outside fluid can be at the outer edge of the protective chuck, or can be somewhat inside the edge, depending on the gas pressure. At high pressure, the gas can exert a strong force against the fluid, with some gas entering the fluid, forming bubbles at the area surrounding and outside the protective chuck. At low pressure, the fluid pushes into the protected area, with some fluid mixing with the gas at the gas exhaust location, forming bubbles at the area surrounding and inside the protective chuck.

In some embodiments, the flow of the gas to the bottom surface of the protective chuck and/or the resistance or conductance of the gas flow path is controlled to achieve a desired gas pressure, and effectively a desired boundary region between the fluid outside the surface region and the gas within the surface region. A desired gas flow can be used, establishing a gas pressure that forms a fluid-gas boundary at the outer edge of the protective chuck, without any bubbles inside or outside of the protected area. In some embodiments, the gas pressure of the gas bearing layer is measured, and used to regulate the gas flow to dynamically achieve a desired gas pressure.

Figure 10A:
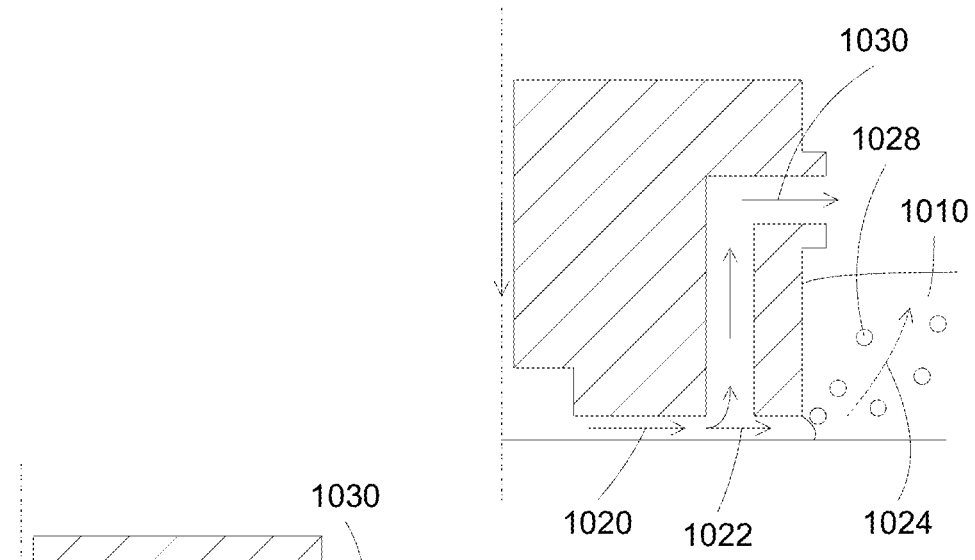
FIGS. 10A-10C illustrate different exemplary modes of operation for a gas bearing layer according to some embodiments of the present invention.
Figure 10B:
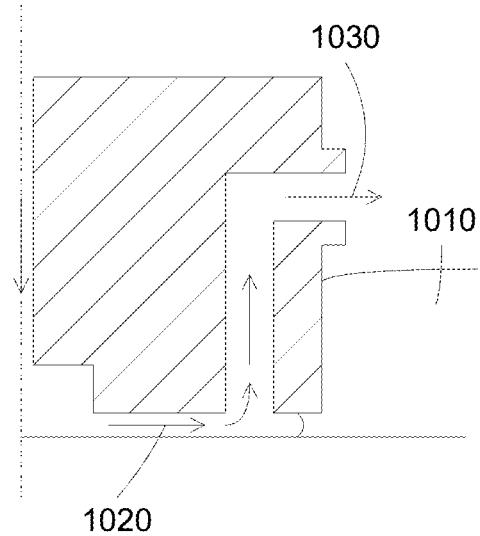
Figure 10C:
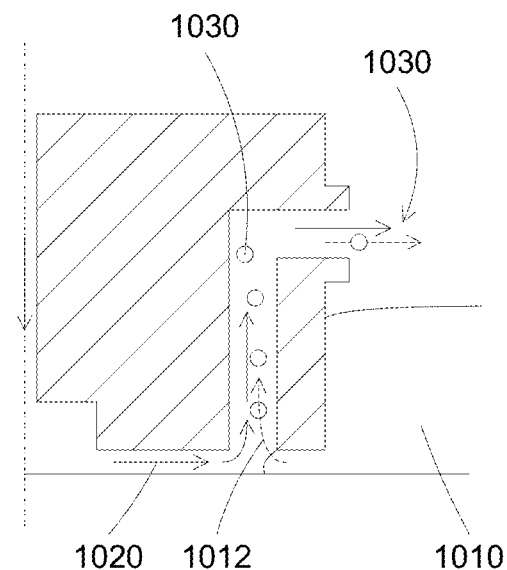

FIGS. 10A-10C illustrate different exemplary modes of operation for a gas bearing layer according to some embodiments of the present invention. In general, if the gas pressure within the gas bearing layer is too high, excess gas can escape to the surrounding fluid, creating bubbles toward the fluid surrounding the protective chuck. The high pressure can be established by a high gas flow, a low flow conductive exhaust, or a protective chuck configuration favoring high pressure gas bearing layer. Conversely, if the gas pressure is too low, outside fluid can enter the gas stream, creating aerated gas flow having fluid bubbles.

FIG. 10A shows a schematic behavior of a protective chuck with high gas bearing layer pressure, for example, created by high gas flow 1020 across the inner flat bottom surface of the protective chuck 1000. A portion 1030 of the gas flow 1020 follows the exhaust. A portion 1022 of the flow 1020 can escape through the fluid 2110, generating a flow 1024 of gas bubbles 1028 at the area surrounding the protective chuck side surface.

FIG. 10C shows a schematic behavior of a protective chuck with low gas bearing layer pressure, for example, created by low gas flow 1020 across the inner flat bottom surface of the protective chuck 1000. With the low pressure, the fluid can enter the exhaust flow stream 1030, generating a flow 1012 of fluid bubbles 1018 within the exhaust flow 1030, creating an aerated flow 1030.

FIG. 10B shows a schematic behavior of the protective chuck with balance gas bearing layer pressure. Both the fluid and gas are blocked at the gas bearing interface, forming a protected region under the protective chuck without bubble formation. The gas-fluid boundary 1070 can be varied across the outer flat area, offering a process window for the balanced gas bearing layer pressure.

In some embodiments, different behaviors of the protective chuck can be controlled by adjusting the gas flow or the exhaust conductance. The adjustment can be performed manually or automatically. For example, the gas flow or the gas conductance can be dynamically controlled according to a pressure measurement of the gas bearing layer.

Figure 11A:
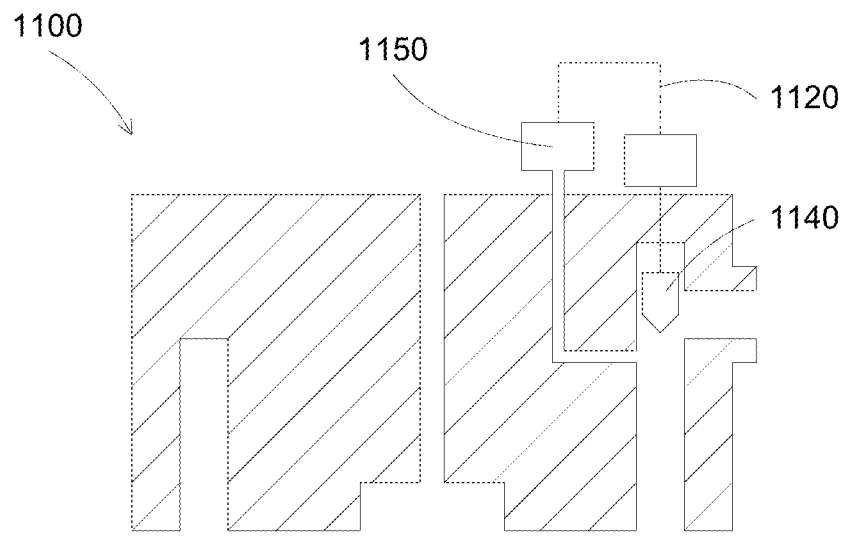
FIGS. 11A-11B illustrate exemplary dynamic controlling of a protective chuck according to some embodiments of the present invention.
Figure 11B:
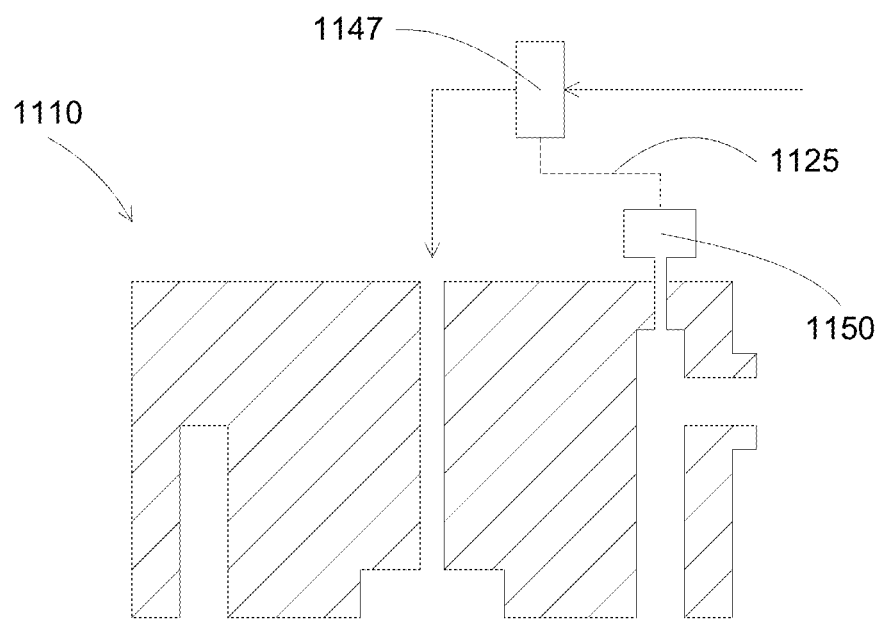

FIGS. 11A-11B illustrate exemplary dynamic controlling of a protective chuck according to some embodiments of the present invention. In FIG. 11A, a protective chuck 1100 comprising a flow conductance valve 1140 and a pressure gauge 1150 are coupled, for example, by an electrical signal path 1120. The conductance of the exhaust flow can be dynamically adjusted based on a pressure reading of the pressure gauge 1150. An optional controller can be included to control the flow valve 1140.

In FIG. 11B, a protective chuck 1100 comprising a pressure gauge 1150, which is coupled to a flow controller 1147, for example, by an electrical signal path 1125. The gas flow to the protective chuck can be dynamically adjusted based on a pressure reading of the pressure gauge 1150. An optional controller can be included to control the flow controller 1147 based on the pressure reading.

In some embodiments, the present invention discloses methods for processing a substrate, by supplying a gas flow to a protective chuck before lowering the protective chuck to the substrate surface. The gas flow forms a gas bearing layer, levitating the protective chuck. The gas pressure of the gas bearing layer prevents the fluid from entering the protected region, and at the same time, preventing the protective chuck from contacting the substrate.

In some embodiments, the present invention discloses systems and methods for processing a substrate, by using a gas bearing layer to levitating the protective chuck, in addition to pressurizing the gap between the protective chuck and the substrate surface. The gas pressure of the gas bearing layer prevents the fluid from entering the protected region.

Figure 12A:
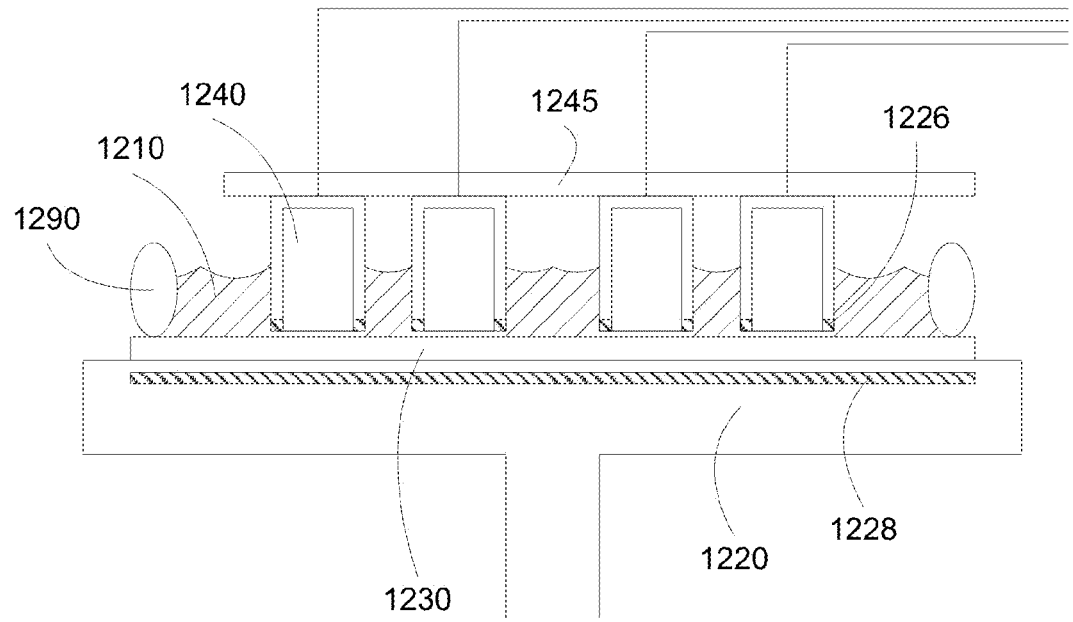
FIGS. 12A-12B illustrate exemplary high productivity combinatorial systems, which employs magnetic levitating protective chucks according to some embodiments of the present invention.
Figure 12B:
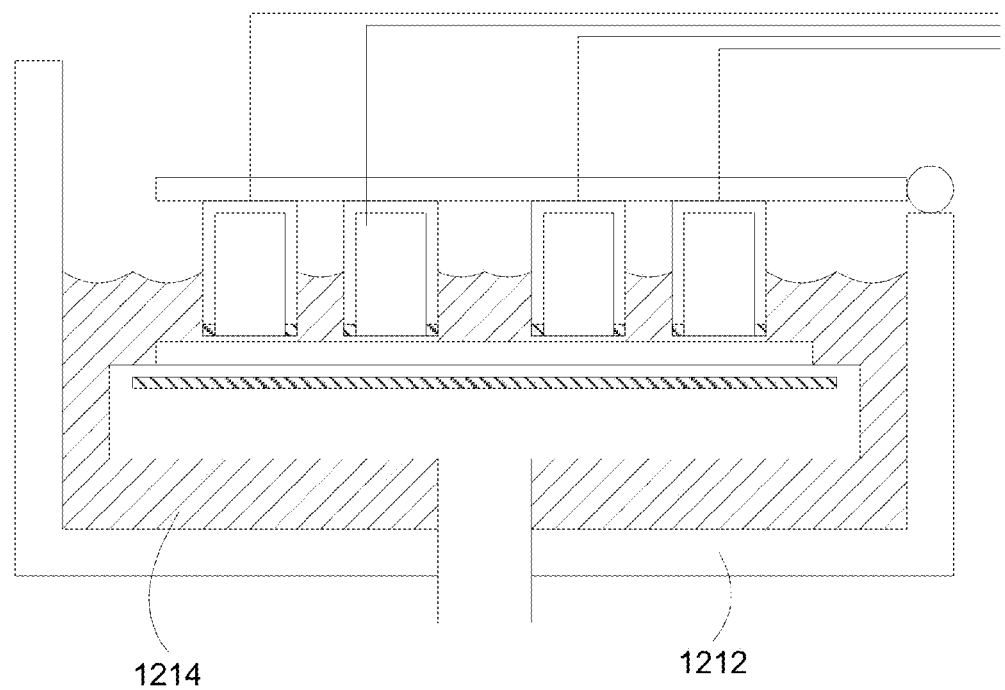

FIGS. 12A-12B illustrate exemplary high productivity combinatorial systems, which employs magnetic levitating protective chucks according to some embodiments of the present invention. In FIG. 12A, a chamber, for example, a processing chamber within a high productivity combinatorial system, comprises a substrate support 1220 having embedded magnetic element 1228. A substrate 1230 can be brought to the process chamber, and disposed on the substrate support 1220. A plurality of reactors 1240, for example, from a reactor assembly 1245, is lowered to the substrate surface. Magnetic repulsion forces between the magnetic elements 1228 in the substrate support 1220 and the magnetic elements 1226 in the reactors 1240 create an air gap between the bottom surface of the reactors 1240 and the substrate surface. Gas flow to the reactors 1240 can pressurize the air gap, forming a gas layer under the reactors 1240. Processing fluid 1210, such as rinsing water to cleaning solution, can be introduced to the substrate surface, outside the regions defined by gas layer under the reactors 1240. The fluid is bounded by a fluid blocking element, such as an o-ring 1290, to contain the fluid within the substrate surface. The gas layer under the reactors 1240 is pressurized, preventing the fluid from entering the regions of the gas layer. The processing of the fluid is then restricted to the substrate surface outside the reactor areas, with the magnetically levitated reactors protecting the surface areas under the reactors.

FIG. 12B shows another processing chamber, comprising a tank 1212 having processing fluid 1214. The substrate, the substrate support, and a portion of the reactors are submerged in the tank 1212. The gas layer under the reactors is pressurized, preventing the fluid from entering the regions of the gas layer. The processing of the fluid is then restricted to the substrate surface outside the reactor areas, with the magnetically levitated reactors protecting the surface areas under the reactors.

FIG. 13 illustrates an exemplary flowchart for processing a substrate using a protective chuck according to some embodiments of the present invention. In operation 1300, a gas flow is supplied to an interior of a protective chuck, wherein the gas exits the protective chuck at a first location of a bottom surface, and a portion of the gas flow returns to the protective chuck at a second location of the bottom surface. In operation 1310, the protective chuck is lowered onto a substrate so that the bottom surface of the protective chuck is disposed in proximity to a surface region of the substrate, wherein the gas flow at the bottom surface causes the protective chuck to be levitated above the surface region, and wherein the gas flow at the bottom surface protects the surface region from a fluid disposed on the substrate outside the surface region. In operation 1320, the gas flow is controlled to achieve a desired boundary region between the fluid outside the surface region and the gas within the surface region. In some embodiments, the flow of the gas to the bottom surface of the protective chuck and/or the resistance or conductance of the gas flow path is controlled to achieve a desired gas pressure, and effectively a desired boundary region between the fluid outside the surface region and the gas within the surface region. Alternatively, or additionally, in operation 1330, a conductance of the gas flow path is controlled to control a gas pressure between the bottom of the protective chuck and the region surface. In some embodiments, the gas flow or the gas conductance is dynamically controlled according to a pressure measurement of the gas bearing layer to achieve a desired pressure of the gas bearing layer. In operation 1340, a gas pressure between the bottom of the protective chuck and the region surface is measured. In operation 1350, the gas flow is dynamically regulated to achieve a desired gas pressure between the bottom of the protective chuck and the region surface.

In some embodiments, the present invention discloses methods for processing a substrate, by establishing a gas bearing layer under a protective chuck to form a non-contact exclusion surface region, free from a fluid processing at other surface areas of the substrate. The present selective processing methods can be used in high productivity combinatorial processes, achieving multiple isolated regions with different properties, which can be used for evaluating and optimizing materials and fabrication process conditions. For example, a large matrix screening can be performed through multiple isolated regions on a single wafer, providing a quick and cost effective way for new device and material developments.

In some embodiments, the present invention discloses methods to process multiple isolated regions on a single substrate, comprising protecting one or more surface regions while wet processing the rest of the substrate surface without contacting the surface. For example, a gas layer can be established between a bottom surface of a protective chuck and a surface region of a substrate. A fluid is then supplied on the remaining surface of the substrate for processing the remaining surface of the substrate. The gas layer protects the surface region, establishing a gas-fluid boundary at the edge of the protective chuck, preventing the surface region under the protective chuck to be processed by the fluid. The surface region is protected by the gas bearing layer, levitating the protective chuck about the substrate surface without contacting the substrate.

FIG. 14 illustrates another exemplary flowchart for processing a substrate using a protective chuck according to some embodiments of the present invention. In operation 1400, a gas layer between a bottom surface of a protective chuck and a surface region of a substrate is established, wherein the gas layer at the bottom surface causes the protective chuck to be levitated above the surface region. In operation 1410, a fluid is supplied on the remaining surface of the substrate for processing the remaining surface of the substrate, wherein the surface region is protected from being processed by the fluid due to the gas layer. In operation 1420, a gas flow or a gas flow path conductance is adjusted to achieve a desired gas pressure at the gas layer. In operation 1440, a gas pressure between the bottom of the protective chuck and the region surface is measured, and the measurement data is used to dynamically regulating the gas flow to achieve a desired gas pressure at the gas layer. In operation 1450, the remaining surface of the substrate is cleaned or wet etched by the fluid. In operation 1460, the substrate is submerged in a fluid tank with the surface region protected by the gas layer of the protective chuck. Alternatively, a fluid can be supplied to the substrate surface, flooding the substrate surface for wet processing. The fluid can perform cleaning of the substrate surface, or can perform wet etching of a top layer on the substrate surface. With one or more protective chucks protecting one or more surface regions, selective wet processing using the supplied fluid can be performed, processing the substrate surface located outside the surface areas protected by the protective chucks. In operation 1470, the gas layer can be adjusted, for example, by varying the pressure or the gas flow to the gas layer can control the formation of bubbles at the gas-fluid interface. For example, the gas layer is regulated to generate bubbles at a boundary region between the fluid outside the surface region and the gas layer within the surface region. As an example, gas bubbles can be generated in the fluid outside the surface region, or fluid bubbles can be generated toward the gas layer.

Figure 15:
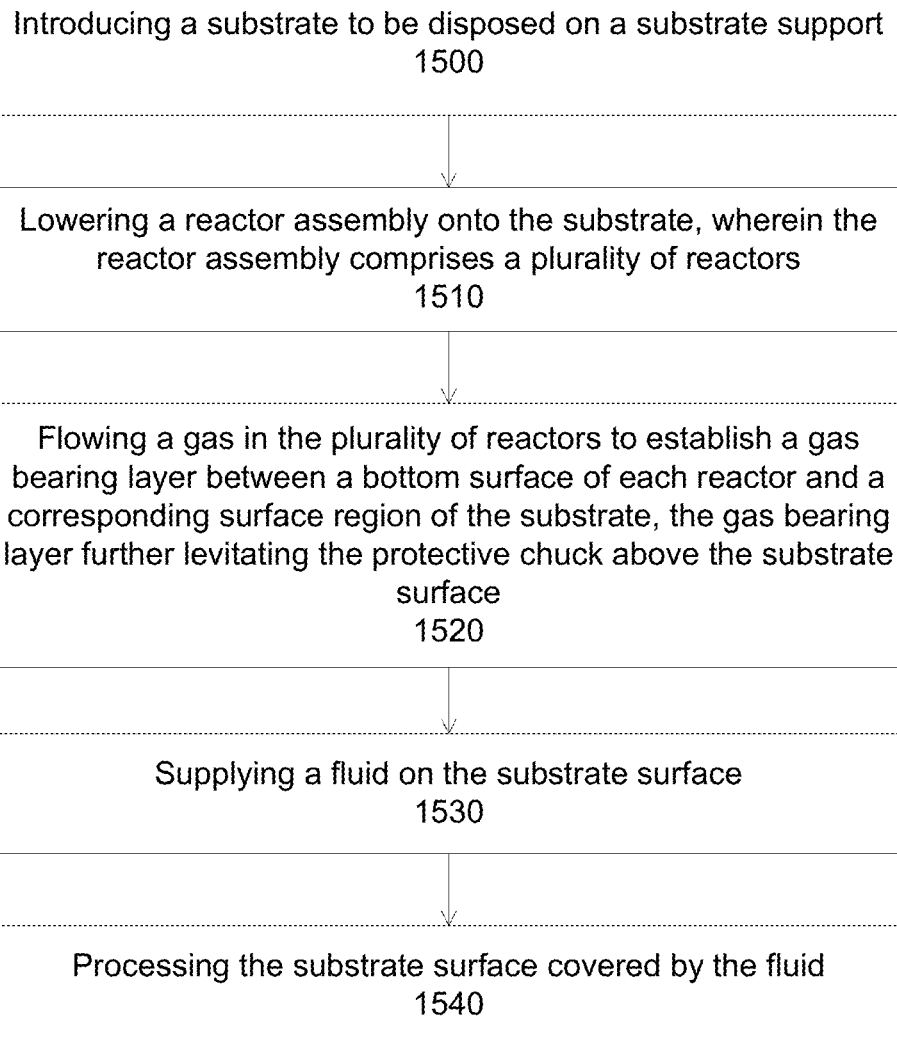
FIG. 15 illustrates an exemplary flowchart for processing a substrate in a high productivity combinatorial system according to some embodiments of the present invention.

FIG. 15 illustrates an exemplary flowchart for processing a substrate in a high productivity combinatorial system according to some embodiments of the present invention. Operation 1500 introduces a substrate to be disposed on a substrate support. Operation 1510 lowers a reactor assembly onto the substrate, wherein the reactor assembly comprises a plurality of reactors. Operation 1520 magnetically levitates the plurality of reactors above the substrate surface. Operation 1530 flows a gas in the plurality of reactors to establish a gas layer between a bottom surface of each reactor and a corresponding surface region of the substrate. Operation 1540 supplies a fluid on the substrate surface. Operation 1550 processes the substrate surface covered by the fluid.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for processing a substrate, comprising
    supplying a gas flow to an interior of a protective chuck to flow across a bottom surface of the protective chuck, the gas exiting the protective chuck at a first location of the bottom surface, a portion of the gas flow returning to the protective chuck at a second location of the bottom surface;
    lowering the protective chuck onto a substrate so that the bottom surface of the protective chuck is disposed in proximity to a surface region of the substrate,
    wherein the gas flow across the bottom surface causes the protective chuck to be levitated above the surface region, and
    wherein the gas flow at the bottom surface protects the surface region from a fluid disposed on the surface of the substrate outside the surface region; and
    submerging the substrate in a fluid tank with the surface region protected by the gas flow from the protective chuck.

2. The method as in claim 1 further comprising controlling the gas flow to achieve a boundary region between the fluid outside the surface region and the gas flow across the surface region.

3. The method as in claim 1 further comprising controlling a conductance of the gas flow path to control a gas pressure between the bottom of the protective chuck and the region surface.

4. The method as in claim 1 further comprising measuring a gas pressure between the bottom of the protective chuck and the region surface.

5. The method as in claim 1 further comprising dynamically regulating the gas flow to achieve a gas pressure between the bottom of the protective chuck and the region surface.

6. A method for processing a substrate, comprising
    establishing a gas layer between a bottom surface of a protective chuck and a surface region of a substrate, wherein the gas layer at the bottom surface causes the protective chuck to be levitated above the surface region;
    submerging the substrate in a fluid tank with the surface region protected by the gas layer of the protective chuck; and
    supplying a fluid on a remaining surface of the substrate for processing the remaining surface of the substrate, wherein the surface region is protected from being processed by the fluid due to the gas layer.

7. The method as in claim 6 further comprising adjusting a gas flow to achieve a gas pressure of the gas layer.

8. The method as in claim 6 further comprising adjusting a gas flow path conductance to achieve a gas pressure of the gas layer.

9. The method as in claim 6 further comprising:
    measuring a gas pressure between the bottom of the protective chuck and the region surface; and
    dynamically regulating the gas flow to achieve a gas pressure of the gas layer.

10. The method as in claim 6 further comprising cleaning the remaining surface of the substrate.

11. The method as in claim 6 further comprising wet etching the remaining surface of the substrate.

12. The method as in claim 6 further comprising regulating the gas layer to not generate bubbles outward or inward of an edge of the protective chuck.

13. The method as in claim 6 further comprising regulating the gas layer to either generate gas bubbles flowing to the fluid outside the surface region or to generate fluid bubbles flowing toward the gas layer.

14. A protective chuck for disposing on a substrate surface to protect a surface region of the substrate by a gas flow layer, the protective chuck comprising
    a bottom surface comprising an outer substantially flat area surrounding a peripheral of the bottom surface, and an inner substantially flat area surrounding an opening;
    a second surface comprising side and top areas of the protective chuck;
    a first gas conduit connecting the second surface with the opening;
    a second gas conduit connecting the second surface with an area between the outer substantially flat area and the inner substantially flat area;
    wherein a gas flow between the first gas conduit and the second gas conduit along the inner substantially flat area forms a gas layer that levitates the protective chuck and protects a surface region of the substrate from a fluid disposed on the substrate outside the surface region; and
    wherein the gas layer protects the surface region when the substrate is submerged in a fluid tank.

15. The protective chuck of claim 14 wherein the opening comprises a recess area, and wherein the first gas conduit comprises a plurality of gas inlets disposed in a peripheral of the recessed area.

16. The protective chuck of claim 14 wherein the second gas conduit comprises a ring inlet coupled to a peripheral area between the inner and outer substantially flat areas.

17. The protective chuck of claim 14 wherein the inner and outer substantially flat areas are formed from a one-piece component.

18. The protective chuck of claim 14 further comprising a pressure gauge coupled to the bottom surface to measure a gas pressure.

19. The protective chuck of claim 14 further comprising a restricting valve coupled to the second gas conduit to regulate a flow resistance of the second gas conduit.

* * * * *